(12) United States Patent
Yi

(10) Patent No.: US 9,949,400 B2
(45) Date of Patent: Apr. 17, 2018

(54) FRONT RACK CABLE MANAGEMENT SYSTEM AND APPARATUS

(71) Applicant: SanDisk Technologies Inc., Plano, TX (US)

(72) Inventor: George Yi, Fremont, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/688,957

(22) Filed: Apr. 16, 2015

(65) Prior Publication Data
US 2016/0309612 A1      Oct. 20, 2016

(51) Int. Cl.
*H05K 7/14*        (2006.01)
*H02G 11/00*     (2006.01)
*H02G 3/04*       (2006.01)

(52) U.S. Cl.
CPC .......... *H05K 7/1491* (2013.01); *H02G 3/0456* (2013.01); *H02G 11/006* (2013.01)

(58) Field of Classification Search
CPC ....... H05K 7/1491; H05K 7/183; F16L 3/015; H02G 3/04; H02G 3/0456; H02G 11/00; H02G 11/006; Y10S 174/09
USPC .......................................................... 211/26
See application file for complete search history.

(56) References Cited

U.S. PATENT DOCUMENTS

| | | |
|---|---|---|
| 3,710,199 A | 1/1973 | Cignoni, Jr. |
| 4,614,383 A | 9/1986 | Polley et al. |
| 5,196,987 A | 3/1993 | Webber et al. |
| 5,245,527 A | 9/1993 | Duff et al. |
| 6,067,233 A * | 5/2000 | English ............... H05K 7/1448 174/135 |
| 6,070,742 A | 6/2000 | McAnally et al. |
| 6,071,142 A | 6/2000 | Blackman |
| 6,160,699 A | 12/2000 | Gibson et al. |
| 6,259,604 B1 * | 7/2001 | Kuster ................. H05K 5/0247 361/724 |
| 6,303,864 B1 | 10/2001 | Johnson et al. |

(Continued)

OTHER PUBLICATIONS

Facebook, "Open Rack Specification V2," Revision 4, Apr. 11, 2014, 9 pages.

(Continued)

*Primary Examiner* — Ko H Chan
(74) *Attorney, Agent, or Firm* — Morgan, Lewis & Bockius LLP

(57) ABSTRACT

Systems, appartuses and devices are used for front cable management of equipment modules mounted in equipment racks. One aspect is directed to an apparatus for front cable management generally including a cable management device for a rack-mounted equipment module supported in an equipment rack. The cable management device generally includes an articulated arm assembly movable between a retracted operational position and a service position extending forwardly out from the equipment rack. Another aspect is directed to a system for front cable management generally including an equipment rack and a rack-mount support for movably positioning a rack-mount equipment module on the equipment rack. The rack-mount support generally includes a front end configured to receive a cable management device for routing cables from a cable zone of the equipment rack to a front end of the rack-mount support.

17 Claims, 9 Drawing Sheets

(56) References Cited

U.S. PATENT DOCUMENTS

| | | |
|---|---|---|
| 6,305,556 B1 | 10/2001 | Mayer |
| 6,326,547 B1 | 12/2001 | Saxby et al. |
| 6,327,139 B1 | 12/2001 | Champion et al. |
| 6,435,354 B1 | 8/2002 | Gray et al. |
| 6,501,020 B2 * | 12/2002 | Grant .................. H02G 3/0456 174/50 |
| 6,523,918 B1 | 2/2003 | Baiza |
| 6,544,057 B1 | 4/2003 | Stremick et al. |
| 6,600,665 B2 | 7/2003 | Lauchner |
| 6,683,252 B2 * | 1/2004 | Sobel .................. H05K 7/1409 174/135 |
| 6,747,874 B2 | 6/2004 | McKinnon et al. |
| 6,767,237 B1 | 7/2004 | Shih |
| 6,805,248 B2 | 10/2004 | Champion et al. |
| 6,854,605 B2 | 2/2005 | Wrycraft |
| 6,902,069 B2 | 6/2005 | Hartman et al. |
| 6,945,504 B2 | 9/2005 | Chen et al. |
| 6,972,949 B1 | 12/2005 | Helgenberg et al. |
| 7,009,112 B1 | 3/2006 | Mead et al. |
| 7,023,708 B2 | 4/2006 | Nguyen et al. |
| 7,026,551 B2 | 4/2006 | Franz et al. |
| 7,121,412 B2 | 10/2006 | Richards et al. |
| 7,168,576 B2 | 1/2007 | Williams |
| 7,189,924 B1 | 3/2007 | Popescu et al. |
| 7,195,511 B1 | 3/2007 | Ornt et al. |
| 7,201,279 B1 | 4/2007 | Mimlitch, III |
| 7,258,583 B1 | 8/2007 | Baiza |
| 7,429,701 B1 | 9/2008 | Kushnir et al. |
| 7,472,795 B2 | 1/2009 | Dubon et al. |
| 7,473,846 B2 | 1/2009 | Doerr et al. |
| 7,554,819 B2 | 6/2009 | Chen et al. |
| 7,568,935 B1 | 8/2009 | Gonzalez et al. |
| 7,654,398 B2 | 2/2010 | Bridges et al. |
| 7,695,305 B1 | 4/2010 | Ray et al. |
| 7,850,478 B2 | 12/2010 | Lin et al. |
| 7,901,241 B1 | 3/2011 | Larkin |
| 8,045,343 B2 | 10/2011 | Fan et al. |
| 8,134,074 B2 | 3/2012 | Ong et al. |
| 8,167,146 B2 | 5/2012 | Yu et al. |
| 8,186,634 B2 | 5/2012 | Chen et al. |
| 8,231,014 B2 | 7/2012 | Chen et al. |
| 8,337,236 B2 | 12/2012 | Shu |
| 8,456,845 B2 | 6/2013 | Liu |
| 8,472,198 B2 * | 6/2013 | Peng .................. G06F 1/16 361/724 |
| 8,477,491 B1 * | 7/2013 | Ross .................. H05K 7/20736 361/679.48 |
| 8,729,389 B2 | 5/2014 | Hallet et al. |
| 8,986,040 B2 | 3/2015 | Garofalo et al. |
| 9,144,174 B2 | 9/2015 | Chen et al. |
| 9,173,312 B1 * | 10/2015 | Jau .................. G11B 33/126 |
| 9,210,828 B2 | 12/2015 | Liao et al. |
| 9,391,402 B2 | 7/2016 | Lin |
| 2001/0026436 A1 | 10/2001 | Tanzer et al. |
| 2003/0209361 A1 | 11/2003 | Sivertsen |
| 2003/0224717 A1 | 12/2003 | Tsai et al. |
| 2004/0120134 A1 | 6/2004 | Nguyen et al. |
| 2006/0011380 A1 | 1/2006 | Pierce |
| 2006/0046557 A1 | 3/2006 | Pulizzi et al. |
| 2006/0113433 A1 | 6/2006 | Chen et al. |
| 2007/0291430 A1 | 12/2007 | Spitaels et al. |
| 2008/0093958 A1 * | 4/2008 | Peterson .................. H04Q 1/064 312/223.1 |
| 2008/0264880 A1 * | 10/2008 | Wagner .................. H05K 7/1489 211/26 |
| 2009/0078834 A1 | 3/2009 | Chen et al. |
| 2010/0087956 A1 | 4/2010 | Regimbal et al. |
| 2011/0100933 A1 | 5/2011 | Kitten |
| 2012/0133255 A1 | 5/2012 | Izuno et al. |
| 2012/0162883 A1 | 6/2012 | Jai |
| 2012/0190225 A1 | 7/2012 | Bessyo et al. |
| 2012/0293932 A1 * | 11/2012 | Jai .................. H05K 7/1491 361/679.02 |
| 2013/0039003 A1 | 2/2013 | Li et al. |
| 2013/0058028 A1 | 3/2013 | Lu et al. |
| 2013/0135792 A1 | 5/2013 | Deshayes |
| 2013/0341471 A1 | 12/2013 | Yang et al. |
| 2014/0183306 A1 | 7/2014 | Chen et al. |
| 2014/0268568 A1 | 9/2014 | Joko et al. |
| 2014/0376870 A1 * | 12/2014 | Takeuchi .................. G02B 6/4452 385/135 |
| 2015/0036272 A1 | 2/2015 | Tachibana et al. |
| 2015/0098168 A1 * | 4/2015 | Liang .................. H05K 7/1492 361/622 |
| 2015/0103488 A1 * | 4/2015 | Tanaka .................. H05K 7/1491 361/679.58 |
| 2016/0037667 A1 * | 2/2016 | Wu .................. H05K 7/1491 312/223.6 |
| 2017/0160771 A1 | 6/2017 | Albrecht et al. |

OTHER PUBLICATIONS

International Search Report and Written Opinion dated Jul. 26, 2016, received in International Patent Application No. PCT/US2016/027924, which corresponds to U.S. Appl. No. 14/688,954, 12 pages (Yi).

* cited by examiner

FRONT RACK CABLE MANAGEMENT SYSTEM AND APPARATUS

TECHNICAL FIELD

The disclosed embodiments relate generally to front cable management of equipment modules mounted in equipment racks.

BACKGROUND

It is well known to use equipment racks for mounting and supporting multiple equipment modules. For example, 19-inch racks are widely used in modern data centers, ISP facilities and corporate server rooms for mounting and supporting various equipment modules, including computing, telecommunication, audio, and/or video equipment.

Currently available cable management arms (CMAs) are mounted on the rear of equipment racks and connected to the rear of the equipment modules accessible from the "hot aisle". In particular, cables are managed by a conventional CMA as a chassis supporting an equipment module is pulled out from the equipment rack in a drawer-like manner for servicing the equipment module from the "cold aisle". As the chassis is pulled out, the space in the back side of the chassis is cleared for the CMA to follow with the chassis movement. Such conventional CMAs are designed for the currently used rack mount servers and storage enclosures that are all designed with I/O cables on rear of the chassis. An example of such a conventional CMA is described in U.S. Patent Application Publication No. 2011/0100933 A1 entitled "Reversible Cable Management Arm".

Recent efforts have been made to arrange I/O cables on the front of equipment racks for ready access from the "cold aisle". For example, the Open Compute Project (OCP) initiated by Facebook calls for an OCP rack that has the same outside dimensions as a conventional 19-inch rack (e.g., 600 mm width), but allows for wider equipment modules. The OCP rack design requires that the I/O cables be arranged on the front of the equipment rack. Unfortunately, conventional CMAs mounted on the front of the rack will block the chassis travel path as it and the equipment module supported thereon are pulled out for service. Also, power buttons, status displays and other items are generally located on the front of an equipment module for simple access by service personnel for service needs from the "cold aisle". Again, conventional CMAs mounted on the front of the rack may block access to the power buttons, status displays and other items, needlessly requiring the service personnel to manually manage the CMAs or cables supported thereon for various service needs.

This is not just the problem for the chassis used in OCP racks; it is well known issue for the most commonly designed blade servers from HP, Dell, and Cisco. Such blade servers have the I/O cable arranged on front and are thus not suited for front cable management using conventional CMAs. Instead, cables are left to dangle and hang on the front of the chassis, and service personnel generally has to disconnect the cables from the chassis (and equipment modules supported thereon) in order to pull the chassis out. Unfortunately, such disconnection will disconnect the data transfer and is not allowed for most applications.

Longer cables dangling on front of the chassis maybe used in order to avoid disconnecting data traffic. In this case, service personnel must manually manage the longer dangling cables while moving the chassis out. These dangled, unmanaged cables block the front of other chassis/modules mounted below the subject chassis, and thus eliminate or reduce the visibility of the status indicators and/or the airflow path of the lower chassis/modules. In some cases, the blockage of air vents could be fatal for the cooling systems of the lower chassis/modules.

In light of the foregoing, it would be beneficial to have systems and apparatuses which overcome the above and other disadvantages of currently available CMAs.

SUMMARY

Various embodiments of systems, apparatuses and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various embodiments are used to facilitate front rack cable management.

One aspect is directed to an apparatus for front cable management generally including a cable management device for a rack-mounted equipment module supported in an equipment rack. The cable management device generally includes an articulated arm movable between a retracted operational position and a service position extending forwardly out from the equipment rack.

Another aspect is directed to a system for front cable management generally including an equipment rack and a rack-mount support for movably positioning a rack-mount equipment module on the equipment rack. The rack-mount support generally includes a front end configured to receive a cable management device for routing cables from a cable zone of the equipment rack to a front end of the rack-mount support.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate pertinent features of the present disclosure and are therefore not to be considered limiting, for the description may admit to other effective features.

Figure 1:
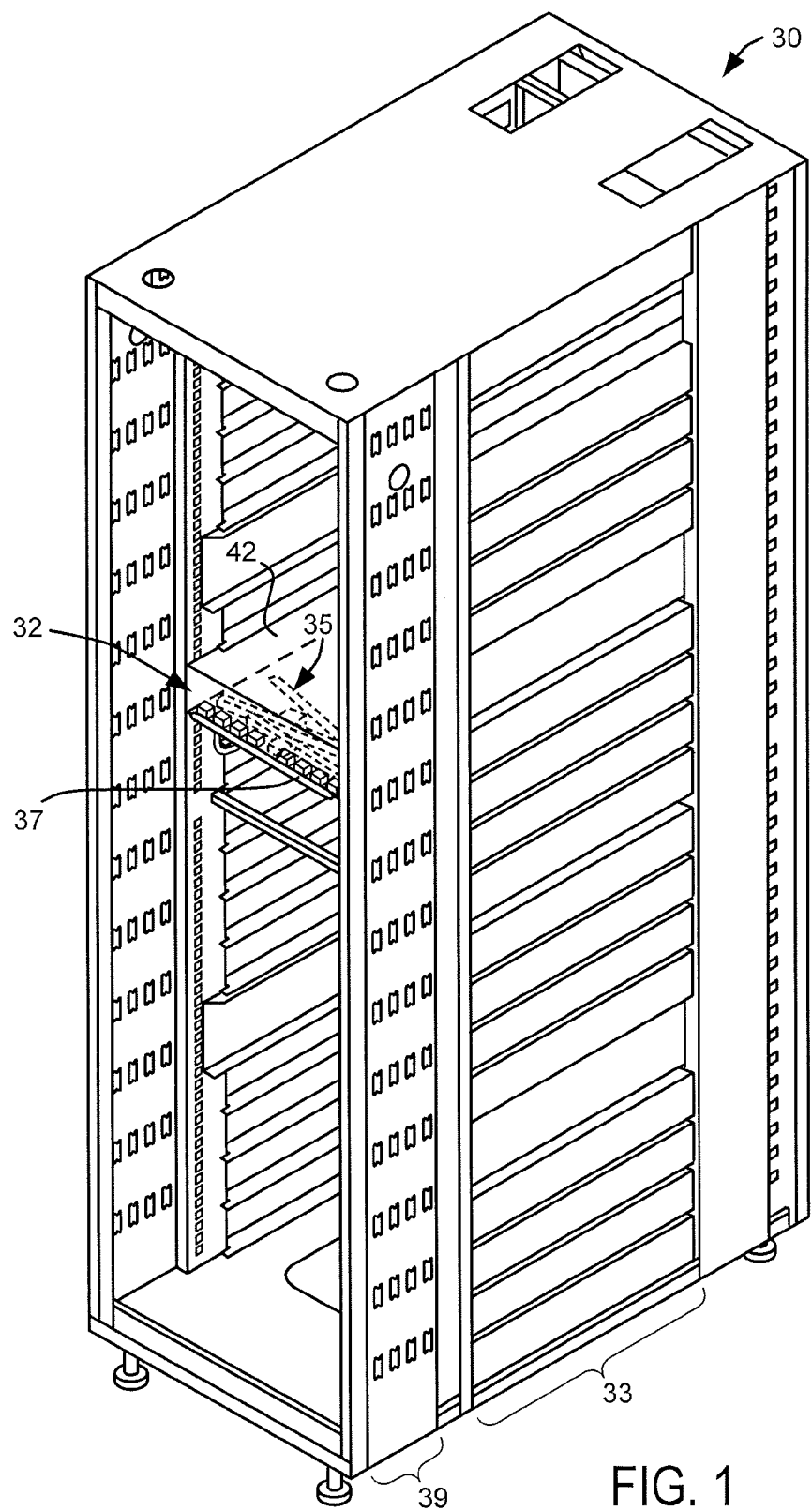
FIG. 1 is a perspective view of an exemplary rack system for front cable management in accordance with various aspects of the present invention, the system including an equipment module and cable management device shown in a retracted operational position.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, apparatus or device. Finally, like reference numerals may be used to denote like features throughout the specification and figures.

DETAILED DESCRIPTION

The various embodiments described herein include systems, apparatuses and/or device for front cable management of an equipment rack having rack-mounted equipment modules movable between a retracted operational position and a service position extending forwardly out from the equipment rack.

Another aspect is directed to a system for front cable management generally including an equipment rack and a rack-mount support for movably positioning a rack-mount equipment module on the equipment rack. The rack-mount support generally includes a front end configured to receive a cable management device for routing cables from a cable zone of the equipment rack to a front end of the rack-mount support.

(A1) More specifically, some embodiments include an apparatus for front rack cable management for a rack-mounted equipment module supported in an equipment rack by a rack-mount support, the apparatus including: a cable management device for routing cables from a front side of the equipment rack to a front end of the rack-mount support, the cable management device including an articulated arm assembly with a rear segment configured to be connected to a stationary mount that is immovable relative to the equipment rack and a front segment configured to be connected to a movable mount that moves with a front end of the rack-mount support, and an articulation joint interconnecting the front and rear segments, wherein the cable management device is configured to move between a folded state when the rack-mount support is in a retracted operational position within the equipment rack and an extended state when the rack-mount support is in a service position extending forwardly out from the equipment rack.

(A2) In some embodiments of the apparatus of A1, the cable management device further includes: a rear connector configured for mounting a rear end of the rear segment to the stationary mount; and a front connector for mounting a front end of the front segment to the movable mount proximal a front end of the rack-mount support, wherein the front connector moves with the rack-mount support between the retracted operational position and the extended service position.

(A3) In some embodiments of the apparatus of A2, the rear connector pivotally connects the rear segment to the stationary mount.

(A4) In some embodiments of the apparatus of any of A2 to A3, the front connector allows the front segment to rotate with respect to the front end of the rack-mount support.

(A5) In some embodiments of the apparatus of any of A2 to A4, the front connector is mounted on the movable mount, which is located on a downward-facing surface of the rack-mount support.

(A6) In some embodiments of the apparatus of any of A2 to A5, at least one of the front and rear segments includes a cable guide for routing one or more cables from the front side of the equipment rack to the front end of the rack-mount support.

(A7) In some embodiments of the apparatus of A6, the cable guide is a passage formed in a respective one of the front and rear segments.

(A8) In some embodiments of the apparatus of A7, the passage is a channel extending along a length of the respective one of the front and rear segments.

(A9) In some embodiments of the apparatus of any of A1 to A8, the rear segment includes an aperture for routing one or more cables from a front cable zone of the equipment rack, wherein the one or more cables pass through the aperture and along the rear segment.

(A10) In some embodiments of the apparatus of any of A1 to A9, the cable management device is positioned immediately below the rack-mount support.

(A11) In some embodiments of the apparatus of A10, the cable management device is positioned within a cable management zone located immediately below the rack-mount support.

(A12) In some embodiments of the apparatus of A11, the cable management zone has a height of approximately 30 mm.

(A13) In some embodiments of the apparatus of any of A1 to A12, the apparatus further including an arm-support assembly connected to the articulated arm assembly and configured to prohibit or reduce sagging of the articulated arm assembly under the weight of one or more cables routed along the articulated arm assembly.

(A14) In some embodiments of the apparatus of A13, the arm-support member includes a support member having one end connected to the rack-mount support and another end connected to the articulated arm assembly.

(A15) In some embodiments of the apparatus of A14, the one end of the support member is pivotally mounted on a lower surface of the rack-mount support.

(A16) In some embodiments of the apparatus of A14 or A15, the another end of the support member is slidably connected to articulation joint of the articulated arm assembly.

(A17) In some embodiments of the apparatus of any of A1 to A16, the rack-mount support is a rack-mount enclosure.

(A18) In some embodiments of the apparatus of A17, further including an enclosure slide assembly movably supporting the rack-mount enclosure, wherein the rack-mount enclosure is moveable between the retracted operational position within the equipment rack and the extended service position extending forwardly out from the equipment rack.

(A19) In some embodiments of the apparatus of any of A1 to A18, the rack-mount support includes: an outer chassis configured for mounting to the equipment rack; an inner chassis configured for housing a rack-mount equipment module, the inner chassis including a front end with one or more cable ports; and a chassis slide assembly movably supporting the inner chassis on the outer chassis, wherein the inner chassis is moveable between the retracted operational position within the equipment rack and the extended service position extending forwardly out from the equipment rack.

(A20) In some embodiments of the apparatus of A19, the rear segment is pivotally connected to the outer chassis.

(A21) In some embodiments of the apparatus of any of A19 to A20, the front segment is rotatably connected to a front end of the inner chassis.

(A22) In some embodiments of the apparatus of any of A19 to A21, the articulated arm assembly is located between a lower surface of the inner chassis and the outer chassis when the inner chassis is in the retracted operational position.

(A23) In some embodiments of the apparatus of any of A19 to A22, the front end of the inner chassis includes one or more cable ports, and the cable management device is for guiding one or more cables from the front side of the equipment rack, along the rear segment and the front segment, and toward the one or more cable ports.

(A24) In some embodiments of the apparatus of any of A1 to A23, the equipment rack is one of a 19-inch rack, a 23-inch rack, or an Open Compute Project (OCP) rack.

(B1) Some embodiments include an apparatus for front rack cable management for a rack-mounted equipment module supported in an equipment rack by a rack-mount support, the apparatus including: a cable management means for routing cables from a front side of the equipment rack to a front end of the rack-mount support, the cable management means including articulation means configured to be connected to a stationary mount that is immovable relative to the equipment rack and configured to be connected to a movable mount that moves with a front end of the rack-mount support, wherein the cable management means is configured to move between a folded state when the rack-mount support is in a retracted operational position within the equipment rack and an extended state when the rack-mount support is in a service position extending forwardly out from the equipment rack.

(B2) In some embodiments of the apparatus of B1, the cable management means further includes: rear connector means configured for mounting a rear end of the rear segment to the stationary mount; and front connector means for mounting a front end of the front segment to the movable mount proximal a front end of the rack-mount support.

(B3) In some embodiments of the apparatus of B1 or B2, the cable management means further includes cable guide means for routing one or more cables from the front side of the equipment rack to the front end of the rack-mount support.

(B4) In some embodiments of the apparatus of any of B1 to B3, the cable management means is positioned immediately below the rack-mount support.

(B5) In some embodiments of the apparatus of B4, the cable management means is positioned within a cable management zone located immediately below the rack-mount support.

(B6) In some embodiments of the apparatus of any of B1 to B5, the apparatus further including an arm-support means configured to prohibit or reduce sagging of the articulation means under the weight of one or more cables routed along the articulation means.

(B7) In some embodiments of the apparatus of B6, the arm-support means is operationally attached to the rack-mount support and the articulation means.

(B8) In some embodiments of the system of any of B1 to B7, further including slide means movably supporting the rack-mount support, wherein the rack-mount support is moveable between the retracted operational position within the equipment rack and the extended service position extending forwardly out from the equipment rack.

(B9) In some embodiments of the apparatus of any of B1 to B6 or B8, the rack-mount support includes: outer chassis means configured for mounting to the equipment rack; inner chassis means configured for housing a rack-mount equipment module; and chassis slide means movably supporting the inner chassis means on the outer chassis means, wherein the inner chassis means is moveable between the retracted operational position within the equipment rack and the extended service position extending forwardly out from the equipment rack.

(B10) In some embodiments of the apparatus of B9, the articulation means is located between the inner chassis means and the outer chassis means when the inner chassis means is in the retracted operational position.

(C1) Some embodiments include a system for front rack cable management, the system including: an equipment rack for mounting a plurality of rack-mount equipment modules therein, the equipment rack including an equipment zone for receiving the plurality of rack-mounted equipment modules, and a cable zone for routing a plurality of cables to the plurality of rack-mounted equipment modules, wherein the cable zone is located forward of the equipment zone; and a rack-mount support for movably positioning a rack-mount equipment module on the equipment rack, wherein the rack-mount support is moveable between a retracted operational position within the equipment zone and an extended service position extending forwardly out from the equipment zone; and wherein a front end of the rack-mount support is configured to receive a cable management device for routing cables from the cable zone of the equipment rack to a front end of the rack-mount support.

(C2) In some embodiments of the system of C1, the rack-mount support is positioned in the equipment rack such that a cable management zone is provided immediately below the rack-mount support, the cable management zone providing free space to receive the cable management device.

(C3) In some embodiments of the system of C2, the cable management zone has a height of approximately 30 mm.

(C4) In some embodiments of the system of any of C1 to C3, the cable management device includes: a rear end connected to a stationary mount that is immovable relative to the equipment rack equipment rack proximal to the cable zone; and a front end connected to a movable mount that moves with a front end of the rack-mount support; wherein the rear end and the front end move relative to one another to accommodate motion of the rack-mount support between the retracted operational position and the extended service position.

(C5) In some embodiments of the system of C4, the cable management device further includes: an articulated arm assembly including front and rear segments, the front end being on the front segment and the rear end being on the rear segment; an articulation joint interconnecting the front and rear segments; a rear connector mounting the rear end to the stationary mount; and a front connector mounting a front end to the movable mount, wherein the front connector moves with the rack-mount support between the retracted operational position and the extended service position.

(C6) In some embodiments of the system of C5, the rear connector pivotally connects the rear segment to the stationary mount.

(C7) In some embodiments of the system of C5 or C6, the front connector allows the front segment to rotate with respect to the front end of the rack-mount support.

(C8) In some embodiments of the system of any of C5 to C7, the front connector is mounted on the movable mount, which is located on a downward-facing surface of the rack-mount support.

(C9) In some embodiments of the system of any of C5 to C8, at least one of the front and rear segments includes a cable guide for routing one or more cables from the front side of the equipment rack to the front end of the rack-mount support.

(C10) In some embodiments of the system of C9, the cable guide is a passage formed in a respective one of the front and rear segments.

(C11) In some embodiments of the system of C10, the passage is a channel extending along a length of the respective one of the front and rear segments.

(C12) In some embodiments of the system of any of C5 to C11, the rear segment includes an aperture for routing one or more cables from a front cable zone of the equipment rack, wherein the one or more cables pass through the aperture and along the rear segment.

(C13) In some embodiments of the system of any of C1 to C12, the equipment rack includes a plurality of support posts, at least one of the plurality of support posts including a recess defining the cable zone.

(C14) In some embodiments of the system of any of C1 to C13, the equipment rack is one of a 19-inch rack, a 23-inch rack, or an Open Compute Project (OCP) rack.

(D1) A system for front rack cable management, the system including: equipment rack means for mounting a plurality of rack-mount equipment modules therein, the equipment rack means including an equipment zone for receiving the plurality of rack-mounted equipment modules, and a cable zone for routing a plurality of cables to the plurality of rack-mounted equipment modules, wherein the cable zone is located forward of the equipment zone; and rack-mount support means for movably positioning a rack-mount equipment module on the equipment rack, wherein the rack-mount support is moveable between a retracted operational position within the equipment zone and an extended service position extending forwardly out from the equipment zone; and a cable management means for routing cables from the cable zone of the equipment rack to a front end of the rack-mount support means.

(D2) In some embodiments of the system of D1, the rack-mount support means is positioned in the equipment rack means such that a cable management zone is provided immediately below the rack-mount support means, the cable management zone providing free space to receive the cable management means.

(D3) In some embodiments of the system of D1 or D2, the cable management means is connected to a stationary mount that is immovable relative to the equipment rack means, and connected to a movable mount that moves with the rack-mount support means.

(D4) In some embodiments of the system of claim any of D1 to D3, the cable management means further includes articulation means interconnecting the stationary and movable mounts.

(D5) In some embodiments of the system of any of D1 to D4, the cable management means further includes cable guide means for routing one or more cables from the equipment rack means to the rack-mount support means.

Numerous details are described herein in order to provide a thorough understanding of the exemplary embodiments illustrated in the accompanying drawings. However, some embodiments may be practiced without many of the specific details, and the scope of the claims is only limited by those features and aspects specifically recited in the claims, including various alternatives, modifications, equivalents and other embodiments, which may be included within the spirit and scope of the claims. Furthermore, well-known components have not been described in exhaustive detail so as not to unnecessarily obscure pertinent aspects of the embodiments described herein.

Figure 2:
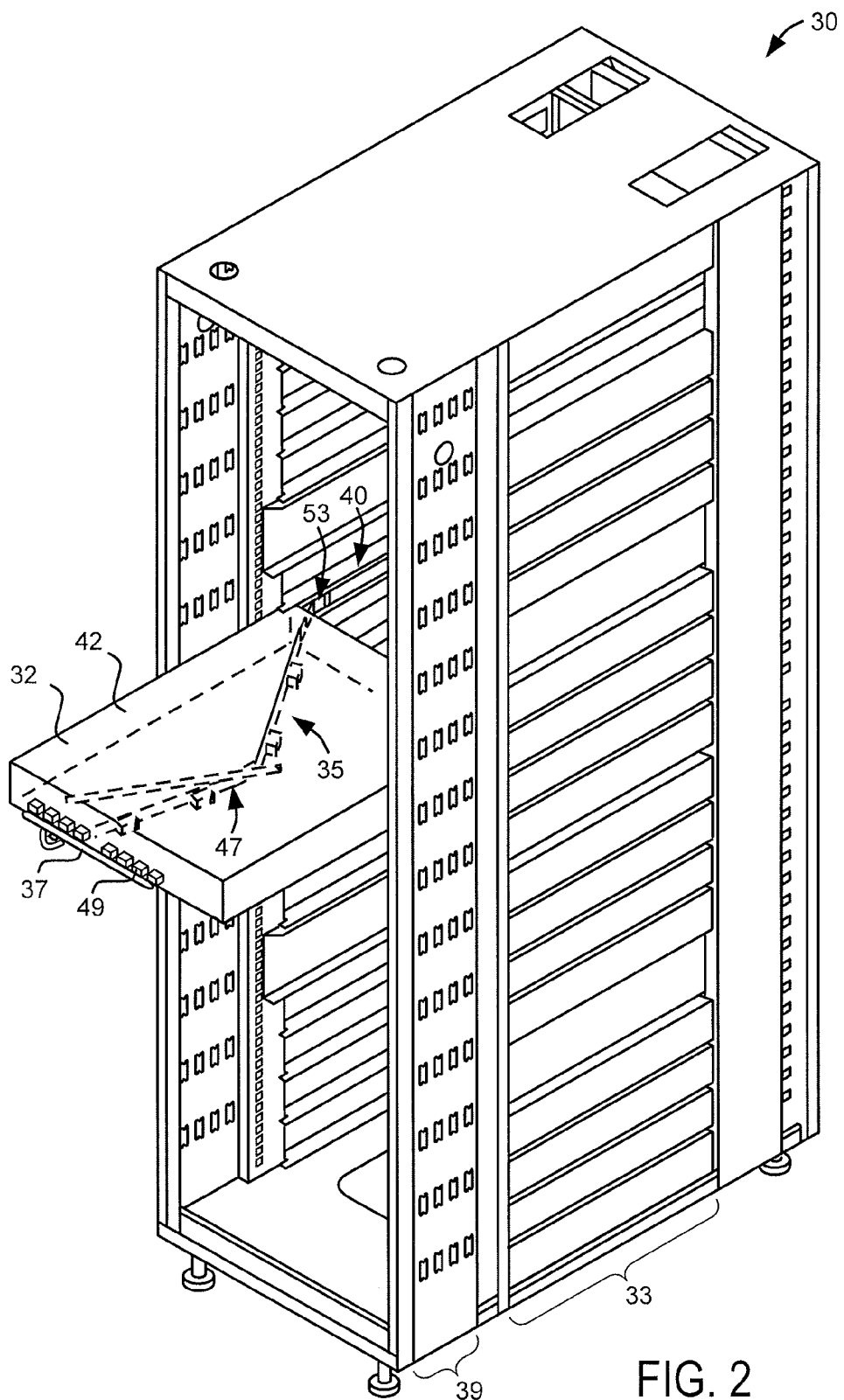
FIG. 2 is a perspective view of the rack system of FIG. 1, with the equipment module and cable management device shown in an extended service position.

Turning now to the drawings, FIGS. 1 and 2, illustrate an exemplary rack system for front cable management in accordance with various aspects of the present invention. The system generally includes an equipment rack 30 for supporting one or more equipment modules 32 movable between a retracted operational position within an equipment zone 33 (FIG. 1) and an extended service position extending forwardly out from the equipment rack (FIG. 2), and a cable management device 35 configured for supporting and routing one or more cables 37 extending from a front cable zone 39 of the equipment rack to the equipment module as it moves between its retracted and extended positions. Although only one equipment module 32 is shown mounted in equipment rack 30, one will appreciate that 1, 2, 3 or more equipment modules may be mounted within the equipment rack.

As used herein, the terms "front" or "forward" may be construed to mean the side of the equipment rack that is most readily accessible to service personnel for viewing status indicators of the equipment modules mounted therein. Thus, the "front" or "forward" side of the equipment rack may be construed to mean the side of the equipment rack facing and closest to the "cold aisle", and also may be construed to mean the side of the equipment rack that is opposite to the rear end of the equipment rack at which a power distribution unit (PDU) is conventionally located. Similarly, the "front" or "forward" side, end, etc. of the equipment modules, the rack-mount support, the chassis and other components may be construed to mean the side, end, etc. that is facing and closest to the "cold aisle".

The equipment rack 30 may take various forms, including but not limited to 19-inch racks, 23-inch racks, OCP racks, and etc. For example, a 19-inch rack is a standardized frame or enclosure for mounting multiple equipment modules, each module having a front panel that is 19 inches (482.6 mm) wide, including protrusions on each side that allow the module to be fastened to the equipment rack. Such racks are generally 600 mm, and 600 mm, 800 mm or 1010 mm deep. Similarly, a 23-inch rack is standardized to accommodate wider equipment modules. The more recent OCP specified equipment rack has the same outside dimensions as a conventional 19-inch rack (e.g., 600 mm wide), but is designed to mount wider equipment modules having widths up to about 21 inches (537 mm). The OCP rack configuration allows wider equipment to fit within the overall footprint of a 19-inch rack.

Figure 8:
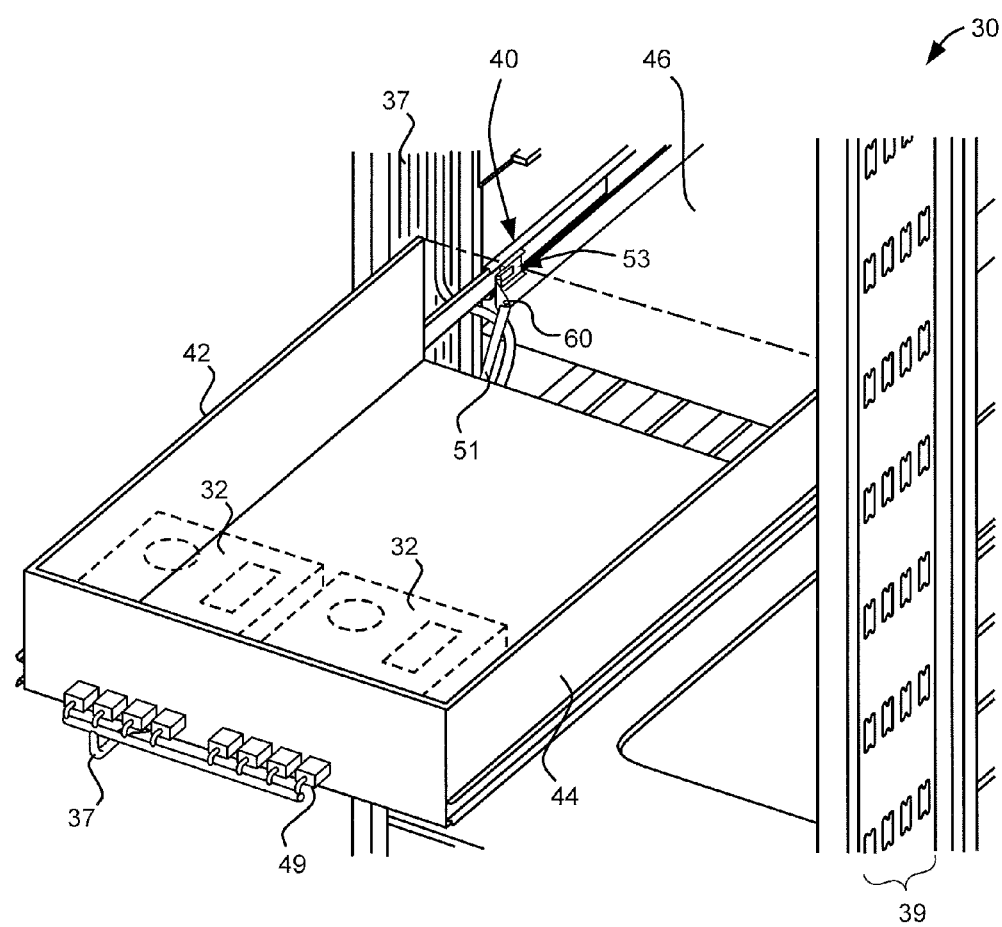
FIG. 8 is an enlarged perspective view of the equipment module of FIG. 1 shown in an extended service position, the equipment module including an inner chassis slidably mounted on an outer chassis to slide between the extended and retracted positions.
Figure 9:
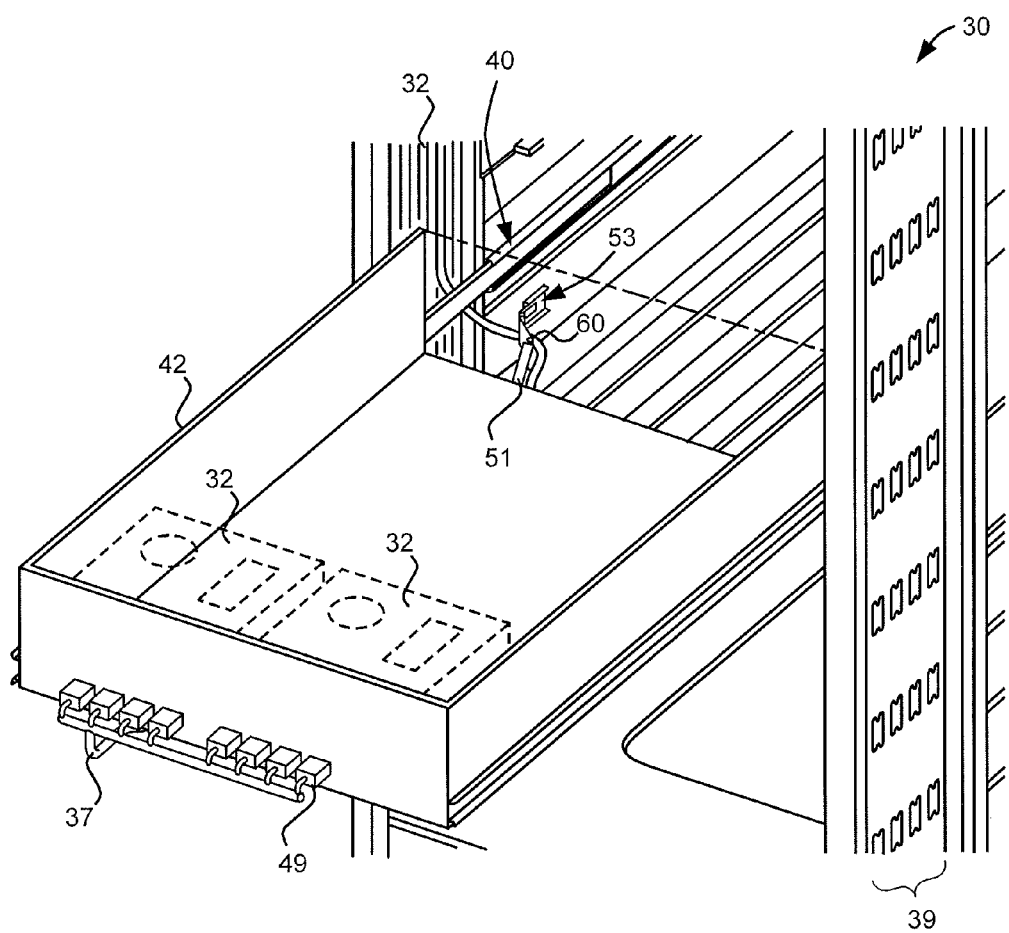
FIG. 9 is an enlarged perspective view of another exemplary equipment module similar to that shown in FIG. 1 and shown in an extended service position, the equipment module including a chassis slidably mounted on an equipment rack.

In some embodiments, the equipment modules 32 are mounted on a slide assembly 40 in order to mount heavy equipment modules and/or frequently-serviced equipment modules to the equipment rack and allow a user to slide and equipment module into and out of the equipment rack 30 for ready access and/or installation (see FIGS. 2, 8 and 9). In some cases, the slide assemblies may be mounted directly to the equipment rack (FIG. 9), or to an outer chassis (FIG. 8) as will be discussed in further detail below. In either case, the slide assembly allows the equipment module to slide partially or fully clear of the equipment rack thus allowing for inspection or maintenance of the equipment module, which may be then slid back into the rack. In some embodiments, the slide assembly may include discrete rails and/or slides interconnecting the equipment rack and the equipment module, integral rails and/or slides, a channel or drawer assembly accommodating the equipment module, bearing assemblies and/or other means to provide a suitable slide means to allow drawer-like sliding of the equipment module between its extended and retraced positions.

In some embodiments, the equipment module 32 may be mounted in or on a rack-mount support 42 that, in turn, is slidably mounted in the equipment rack 30. In the illustrated embodiment, the rack-mount support is an enclosed chassis, however, one will appreciate that other suitable framework or structures may be used, including but not limited to open chassis, subracks, and the like. In some embodiments, the equipment module 32 may be mounted in or on an inner chassis 44 that is slidably mounted within or on an outer chassis 46, which in turn is mounted in the equipment rack. And in some embodiments, the equipment module itself may serve as the rack-mount support, with the equipment module itself being slidably connected to the equipment rack.

The equipment modules are generally configured with industry-accepted dimensions defined in multiples of a "rack unit" (U or RU), or in the case of an OCP rack, defined in multiples of an "OpenU". A typical RU is a unit of measure that describes the height of equipment designed to mount in a 19-inch rack or a 23-inch rack. The 19-inch (482.6 mm) or 23-inch (584.2 mm) dimension reflects the width of the equipment mounting-frame in the equipment rack (the width of the equipment module that can be mounted inside the rack is less). One rack unit (RU) is 1.75 inches (44.45 mm) high, while an OpenU is slightly larger at 48 mm high. The RU or OpenU represents the overall allocated vertical height of the equipment rack. The actual dimensions of a front panel of an equipment module (or filler panel for a vacant space in a rack) is not an exact multiple of 1.75 inches (44.45 mm). To allow space between adjacent rack-mounted components, an equipment module or a filler panel is generally $\frac{1}{32}$ inch (0.031 inch or 0.79 mm) less in height than the full number of rack units would imply. Thus, a 1 U front panel would be 1.719 inches (43.66 mm) high. If n is number of rack units, the formula for panel height is h=(1.750n–0.031) inch= (44.45n–0.79) mm.

Figure 3:
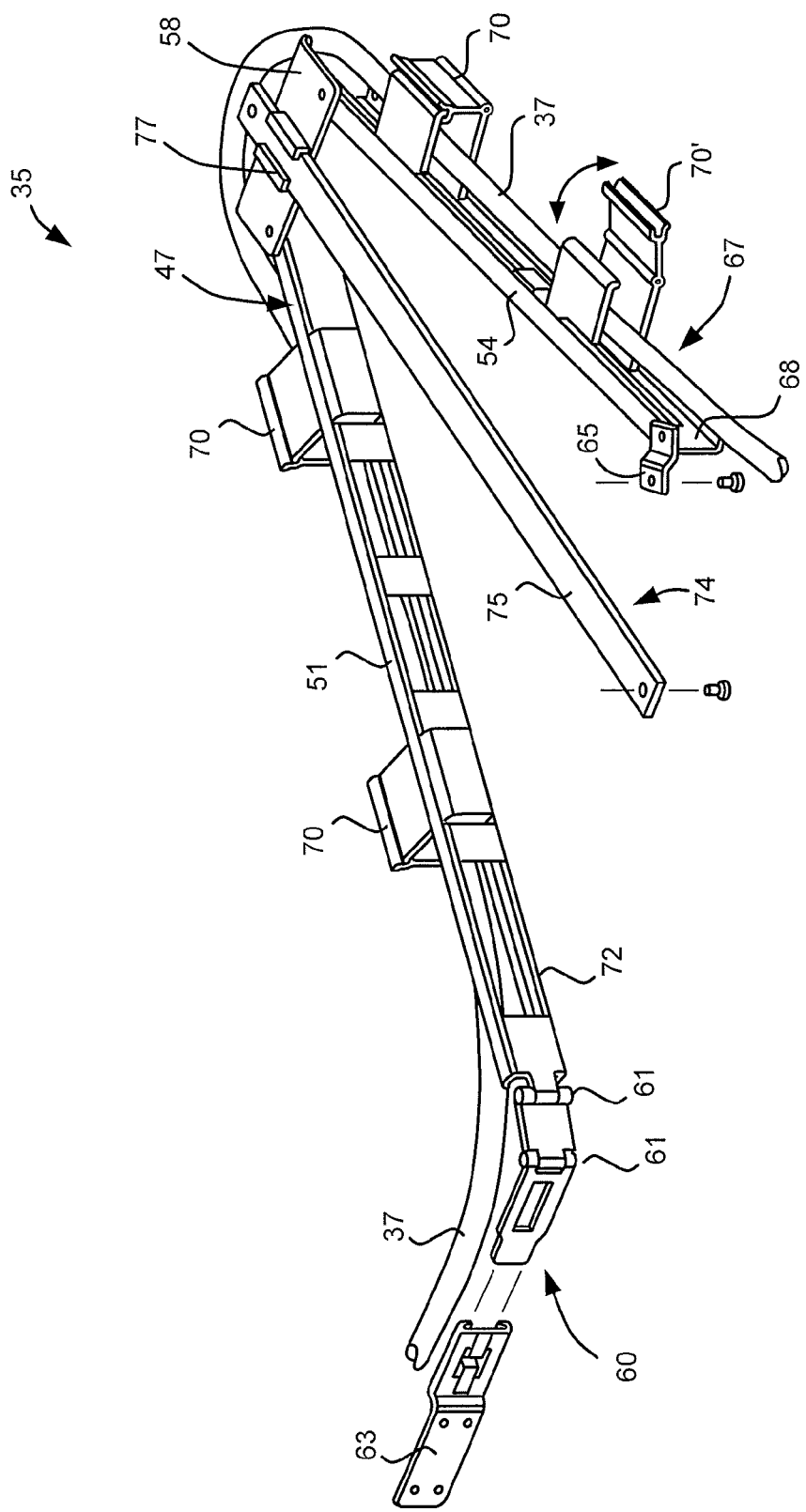
FIG. 3 is an enlarged perspective view of the cable management device of FIG. 1.

Turning now to FIG. 3, in some embodiments the cable management device includes an articulated arm assembly 47 for routing one or more cables from a front side 39 of the equipment rack to one or more cable ports 49 located on a front end of the equipment module 32. The articulated arm assembly generally includes a rear segment 51 configured to be connected to a stationary mount 53 in FIG. 2 that is immovable relative to the equipment rack, and a front segment 54 configured to be connected to a movable mount 56 in FIG. 4 that moves with a front end of the equipment module 32. In some embodiments, the articulation arm includes an articulation joint 58 interconnecting the front and rear segments.

Figure 6:
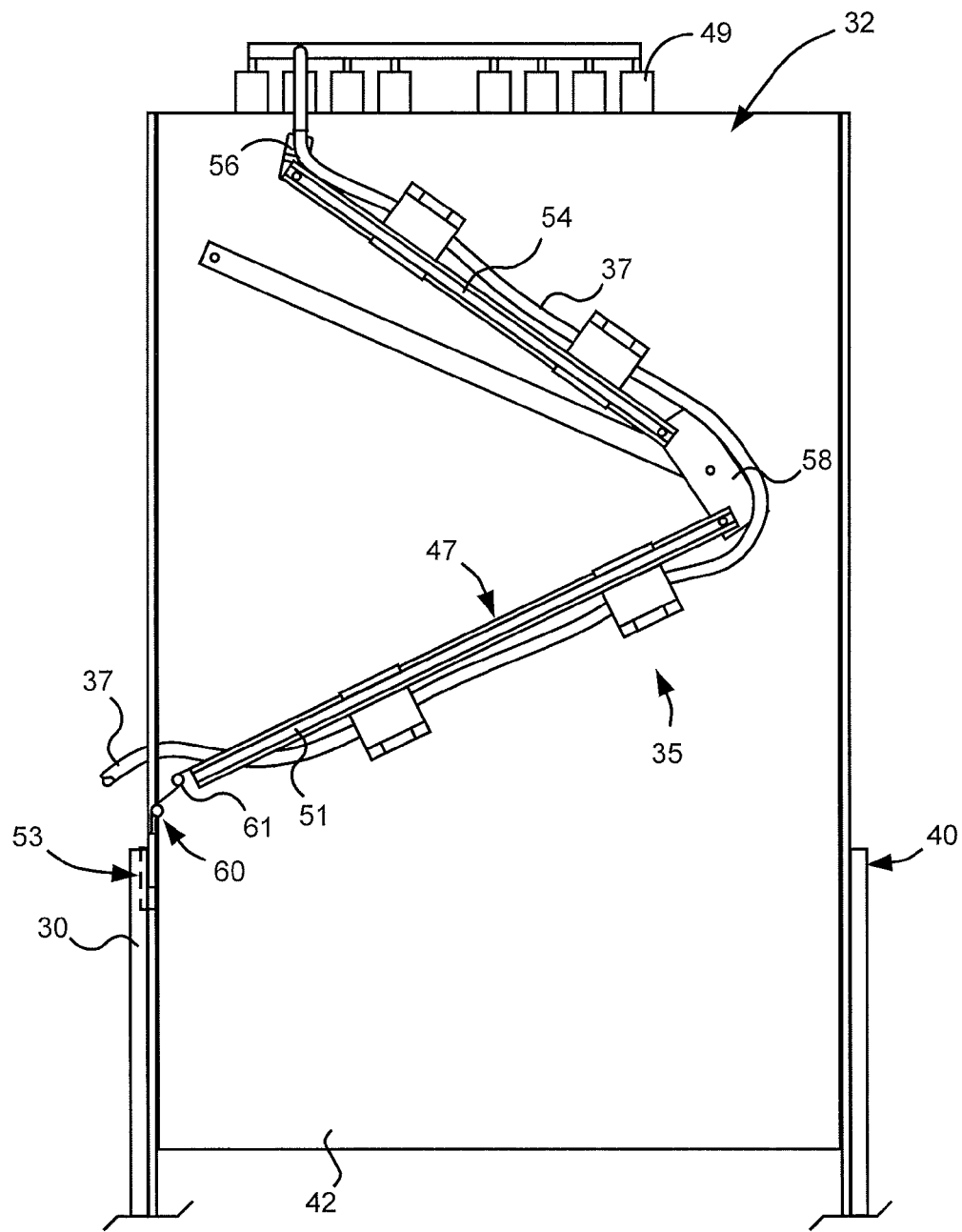
FIG. 6 is a bottom view of the underside of the equipment module and cable management device of FIG. 1 shown in a partially extended position.
Figure 7:
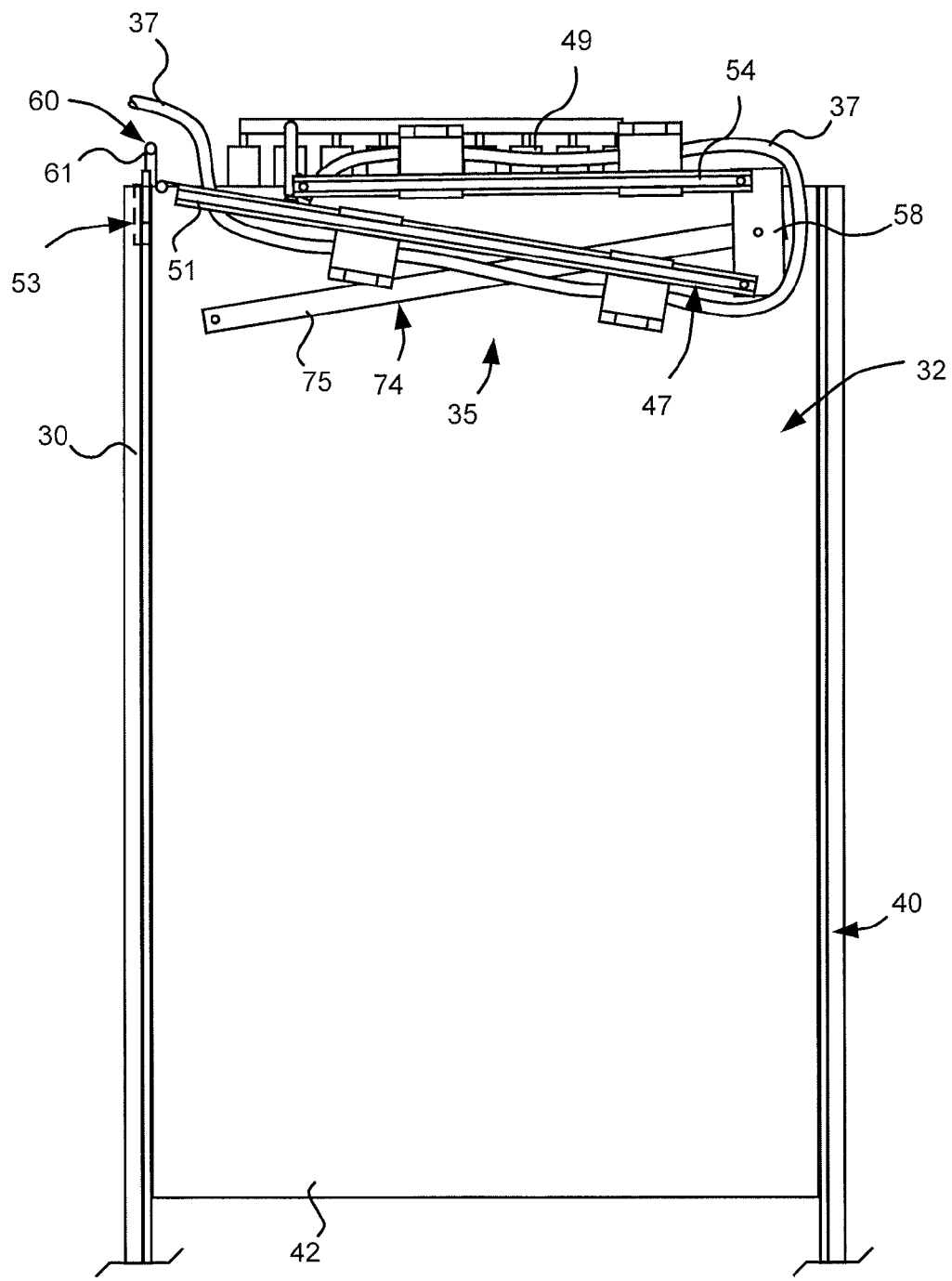
FIG. 7 is a bottom view of the underside of the equipment module and cable management device of FIG. 1 shown in a retracted operational position.

The cable management device 35 is configured to move between a folded state when the rack-mount support is in a retracted operational position within the equipment rack (FIG. 1) and an extended state when the rack-mount support is in a service position extending forwardly out from the equipment rack (FIG. 2). The cable management device 35 is also configured to support and guide cables extending from the front cable zone 39 of the equipment rack 30 as the equipment modules moves from the fully extended service position (FIGS. 1 and 5), through a partially extended intermediate position (FIG. 6), to a retracted operational position (FIGS. 2 and 7), and back again.

In some embodiments, a rear connector 60 is configured for mounting a rear end of the rear segment 51 to the stationary mount 53. In the illustrated embodiment, the rear connector is a quick-release bracket used to quick-releasably interconnect the rear segment of the articulated arm assembly (or outer chassis) to the equipment rack without the need for tools. One will appreciate that rear connector may take various forms including, but not limited to, various brackets that may or may not require the use of tools, various fasteners and/or fastening means, and other suitable means. In some embodiments, the rear connector includes one or more hinges 61 that pivotally connect the rear segment to the stationary mount, directly or indirectly. One will appreciate that various means may be used to pivotally connect the rear segment to the stationary mount.

In some embodiments, a flange 63 is affixed to the stationary mount 53 and is immovable relative to the equipment rack. One will appreciate, however, that the stationary mount may be a surface portion or screw hole(s) of the equipment rack to which the rear segment of the articulated arm is pivotally attached. For example, the rear connector of the rear segment may be screwed, bolted, soldered, welded or otherwise affixed directly to the equipment rack and/or to a bracket or support affixed directly to the equipment rack.

In some embodiments, a front connector 65 is configured for mounting a front end of the front segment 54 to the movable mount 56 (FIG. 4) proximal a front end of the equipment module 32 such that the front segment 54 may rotate with respect to the front end of the equipment module 32. In the illustrated embodiment, the movable mount is a surface portion of an underside of the equipment module or screw hole(s) in an underside of the equipment module, that is, to a downward-facing surface or a bottom surface of the equipment module. One will appreciate that the movable mount may be located on a front surface of the equipment module, for example, the front connector may have a L-shaped flange overlapping and affixed a portion of the front surface equipment module. Similarly, one will appreciate that the movable mount may be a surface portion on, or screw hole(s) in, a top surface of the equipment module, in which case the cable management device may be positioned above the equipment module. Accordingly, the specific location of the movable mount may vary provided that it is readily accessible from the front of the equipment rack. As such, one will appreciate that the movable mount may be located on similar surfaces of the rack-mount support, the chassis, and/or the inner chassis which would move with the equipment module between its retracted operation position and its extended service position.

In some embodiments, the front connector 65 allows the front segment 54 to rotate with respect to the front end of the equipment module 32. In some embodiments, the front connector is configured to allow the front segment to rotate with respect to the forward end of the rack-mount support, a forward end of the rack-mount support, or a forward end of the rack-mounted equipment module.

In some embodiments, joint 58 is a linkage pivotally interconnecting the front and rear segments 54, 51 such that the pivot points of the front and rear segments are spaced apart from one another (FIG. 3). One will appreciate that the joint may take other structures or forms. For example, the joint may simply be a common pivot for both segments.

Figure 5:
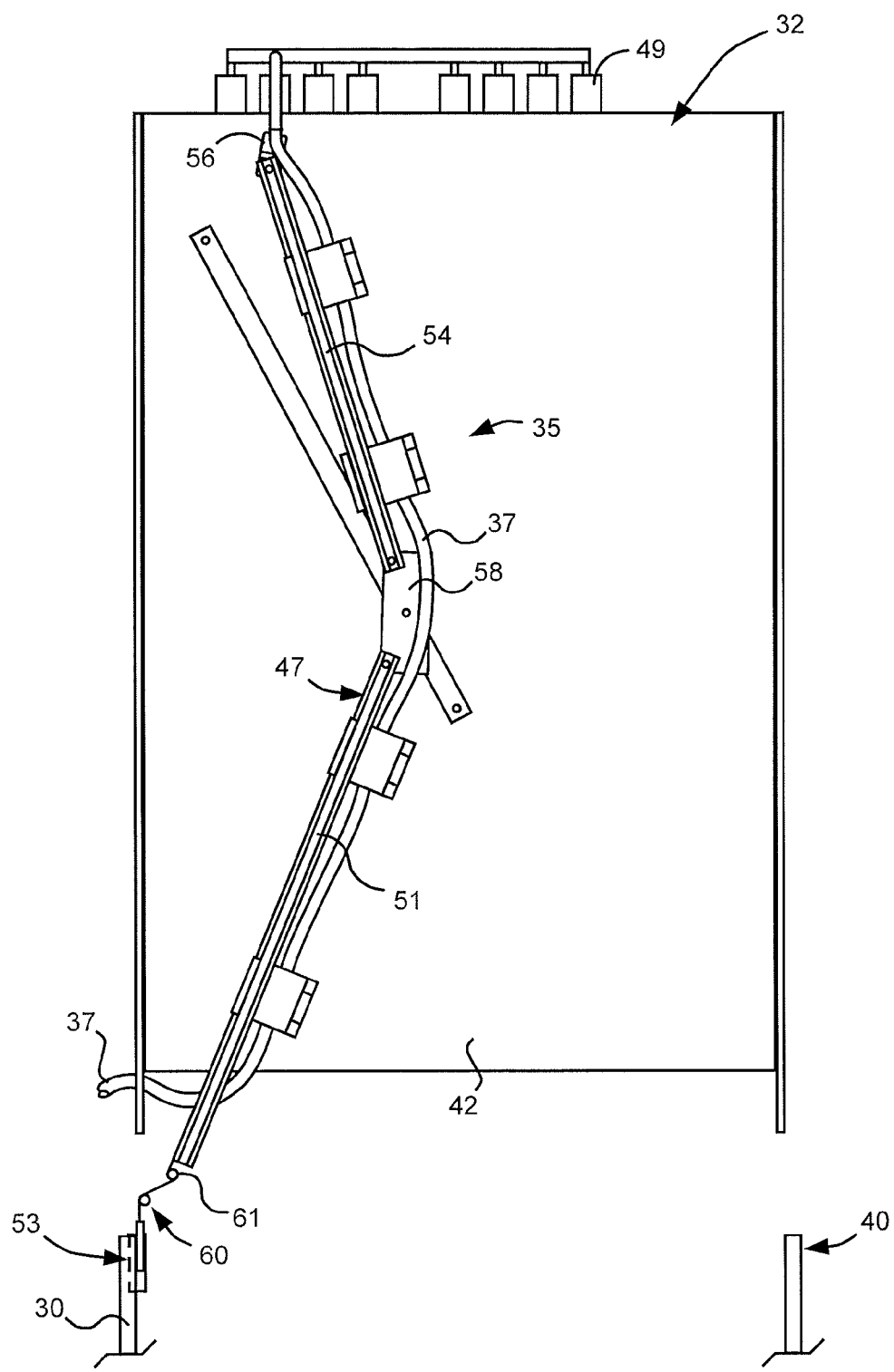
FIG. 5 is a bottom view of the underside of the equipment module and cable management device of FIG. 1 shown in an extended service position.

With continued reference to FIG. 3, the articulated arm assembly 47 includes a cable guide 67 for routing one or more cables from the front end of the equipment rack to the front end of the equipment module 32. In some embodiments, the cable guide may include a passage and/or open channel 68 extending along a length of one or both of the front and rear segments 54, 51. In some embodiments, the cable guide may include cable holders 70 through which one or more cables may extend. As shown in FIG. 3, the cable holders may be configured to be readily opened (e.g., 70') and closed (e.g., 70) without the need for tools so as to facilitate installation of the cable management assembly. In some embodiments, the cable guide may include one or more apertures 72 formed in a one or both of the front and rear segments to allow the cable to pass through the respective segment (FIG. 5).

Figure 4:
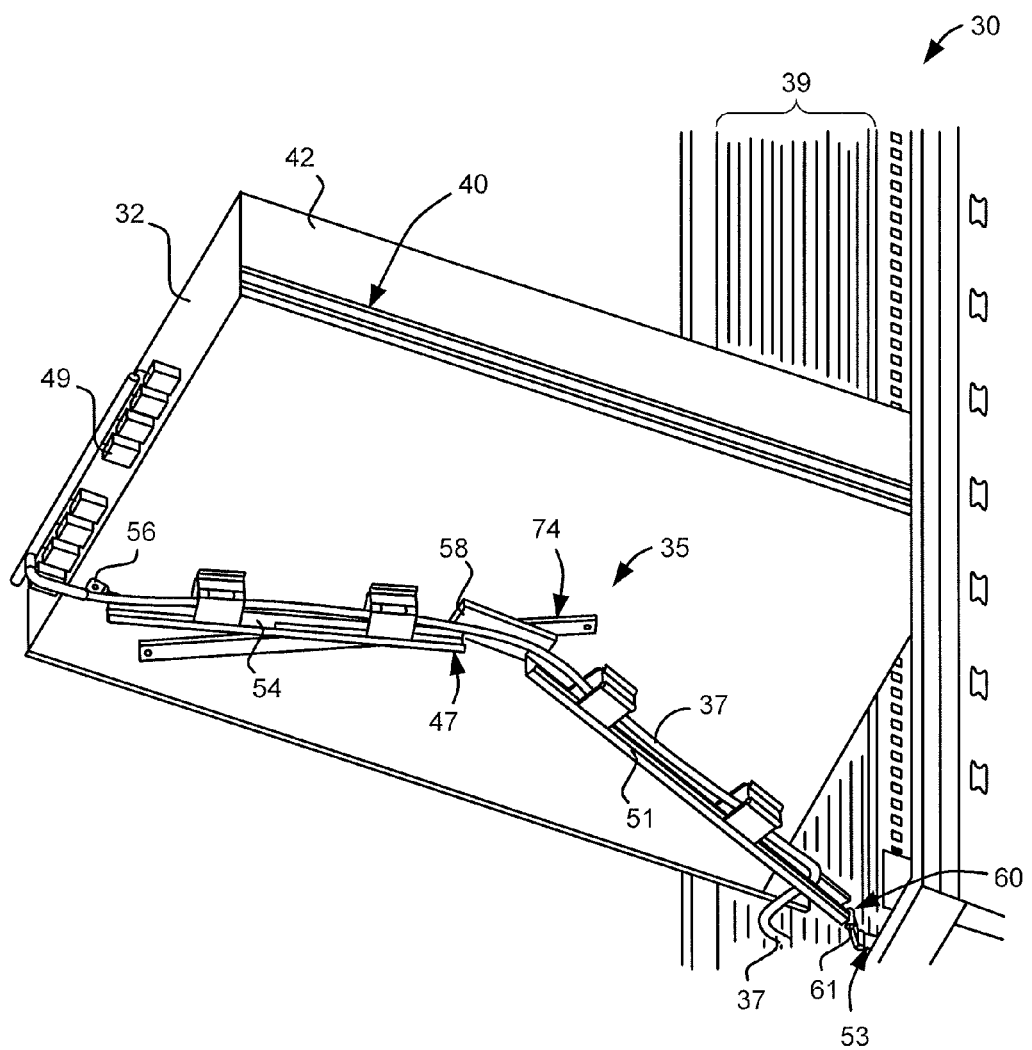
FIG. 4 is an enlarged perspective view of the underside of the equipment module and cable management device of FIG. 1 shown in an extended service position.

As shown in FIG. 4, in some embodiments the cable management device is positioned immediately below the equipment module 32 such that the cable management device may extend in a cable management zone (CMZ), for example, the space defined between the underside surface of the subject equipment module and the top surface of another lower-mounted equipment module. In some embodiments the vertical height of the cable management device may be about ¾ to 1½ inch (about 20 to 40 mm), preferably about 1 to 1¼ inch (about 25 to 35 mm), and more preferably about 30 mm (about 1³⁄₁₆ inches).

In some embodiments, an arm-support assembly 74 may be provided to prohibit or reduce sagging of the articulated arm assembly under the weight of one or more cables routed along the articulated arm. The arm-support assembly may be mounted to an underside of the equipment module 32 and arranged to support a portion of the articulated arm assembly. For example, the arm support assembly may be attached to joint 58 of the articulated arm assembly, as shown in FIG. 3.

In some embodiments, the arm-support assembly may include a support member 75 that includes a first end pivotally connected to the equipment module 32, and a second end slidably and/or rotatably connected to joint 58 by a sleeve 77. One will appreciate that the one end may be similarly connected to a rack-mount support, a chassis, or an inner chassis. One will also appreciate that other means may be utilized to reduce sagging of the articulated arm assembly.

Turning now to FIGS. 8 and 9, in some embodiments the equipment module may be removably mounted in an inner chassis 44 slidably mounted within or on an outer chassis 46 that is mounted on the equipment rack 30 (FIG. 8), and in some embodiments the equipment module 32 may be removably mounted in an equipment chassis (e.g., rack-mount support 42) or other suitable framework or enclosure that is itself slidably mounted on the equipment rack 30 (FIG. 9).

In the case of the former (FIG. 9), slide assembly 40 slidably mounts the inner chassis 44 to the outer chassis 46, whereby the cable management device may be pre-installed on the inner/outer chassis configuration prior to installation within an equipment rack. The vertical space defined by an underside of the inner chassis and the adjacent surface of the outer chassis is the cable management zone (CMZ shown in FIG. 4) that provides the free space that receives the cable management device 35.

In the case of the latter, slide assembly 40 interconnects chassis (e.g., rack-mount support 42) directly to equipment rack 30. In this case, the vertical space defined between an underside of the subject equipment module and the top surface of another lower-mounted equipment module is the cable management zone (CMZ) that provides the free space that receives the cable management device 35.

It will be understood that, although the terms "first," "second," etc. may be used herein to describe various elements, these elements should not be limited by these terms. These terms are only used to distinguish one element from another. For example, a first end could be termed a second end, and, similarly, a second end could be termed a first end, without changing the meaning of the description, so long as all occurrences of the "first end" are renamed consistently and all occurrences of the "second end" are renamed consistently. The first end and the second end are both ends, but they are not the same end.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. A system for front rack cable management, the system comprising:
    an equipment rack for mounting a plurality of rack-mount equipment modules therein, the equipment rack including an equipment zone for receiving the plurality of rack-mounted equipment modules, and a cable zone for routing a plurality of cables to the plurality of rack-mounted equipment modules, wherein the cable zone is located forward of the equipment zone;
    a rack-mount support for movably positioning a rack-mount equipment module on the equipment rack, wherein:
        the rack-mount support is moveable, while slidably mounted in the equipment rack, between a retracted operational position within the equipment zone and an extended service position extending forwardly out from the equipment zone; and
        a front end of the rack-mount support, proximal a front end of the rack-mount equipment module, is configured to receive a cable management device for routing cables from the cable zone of the equipment rack to ports located on the front end of the rack-mount equipment module, as the rack-mount support moves between the retracted operation position and the extended service position; and
    the cable management device;
    wherein the rack-mount support is positioned in the equipment rack such that a cable management zone is provided immediately below the rack-mount support, the cable management zone providing free space to receive the cable management device.

2. A system according to claim 1, wherein the cable management zone has a height of approximately 30 mm.

3. A system for front rack cable management, the system comprising:
an equipment rack for mounting a plurality of rack-mount equipment modules therein, the equipment rack including an equipment zone for receiving the plurality of rack-mounted equipment modules, and a cable zone for routing a plurality of cables to the plurality of rack-mounted equipment modules, wherein the cable zone is located forward of the equipment zone;
a rack-mount support for movably positioning a rack-mount equipment module on the equipment rack, wherein:
the rack-mount support is moveable, while slidably mounted in the equipment rack, between a retracted operational position within the equipment zone and an extended service position extending forwardly out from the equipment zone;
a front end of the rack-mount support, proximal a front end of the rack-mount equipment module, is configured to receive a cable management device for routing cables from the cable zone of the equipment rack to ports located on the front end of the rack-mount equipment module, as the rack-mount support moves between the retracted operation position and the extended service position; and
the cable management device, wherein the cable management device comprises:
a rear end connected to a stationary mount that is immovable relative to the equipment rack proximal to the cable zone; and
a front end connected to a movable mount that moves with the front end of the rack-mount support, wherein the movable mount is located, both when the rack-mount support is in the retracted operational position and when the rack-mount support is in the extended service position, on a surface of the rack-mount support or a surface of the rack-mount equipment module; and
the rear end and the front end of the cable management device move relative to one another to accommodate motion of the rack-mount support between the retracted operational position and the extended service position.

4. A system according to claim 3, wherein the cable management device further comprises:
an articulated arm assembly including front and rear segments, the front end of the cable management device being on the front segment and the rear end being on the rear segment;
an articulation joint interconnecting the front and rear segments;
a rear connector mounting the rear end to the stationary mount; and
a front connector mounting the front end of the cable management device to the movable mount, wherein the front connector moves with the rack-mount support between the retracted operational position and the extended service position.

5. A system according to claim 4, wherein the rear connector pivotally connects the rear segment to the stationary mount.

6. A system according to claim 4, wherein the front connector and moveable mount are configured to allow the front segment to rotate with respect to the front end of the rack-mount support.

7. A system according to claim 4, wherein the front connector is mounted on the movable mount, which is located on a downward-facing surface of the rack-mount support.

8. A system according to claim 4, wherein at least one of the front and rear segments includes a cable guide for routing one or more cables from a front side of the equipment rack to the front end of the rack-mount support.

9. A system according to claim 8, wherein the cable guide is a passage formed in a respective one of the front and rear segments.

10. A system according to claim 9, wherein the passage is a channel extending along a length of the respective one of the front and rear segments.

11. A system according to claim 4, wherein the rear segment includes an aperture for routing one or more cables from the cable zone of the equipment rack, wherein the one or more cables pass through the aperture and along the rear segment.

12. A system according to claim 1, wherein the equipment rack further includes a plurality of support posts, at least one of the plurality of support posts including a recess defining the cable zone.

13. A system according to claim 1, wherein the equipment rack is one of a 19-inch rack, a 23-inch rack, or an Open Compute Project (OCP) rack.

14. A system for front rack cable management, the system comprising:
equipment rack means for mounting a plurality of rack-mount equipment modules therein, the equipment rack means including an equipment zone for receiving the plurality of rack-mounted equipment modules, and a cable zone for routing a plurality of cables to the plurality of rack-mounted equipment modules, wherein the cable zone is located forward of the equipment zone;
rack-mount support means for movably positioning a rack-mount equipment module on the equipment rack means, wherein the rack-mount support means is moveable, while slidably mounted in the equipment rack means, between a retracted operational position within the equipment zone and an extended service position extending forwardly out from the equipment zone; and
a cable management means for routing cables from the cable zone of the equipment rack means to ports located on a front end of the rack-mount equipment module, proximal a front end of the rack-mount support means, as the rack-mount support means moves between the retracted operation position and the extended service position;
wherein:
the front end of the rack-mount support means is configured to receive the cable management means; and
the rack-mount support means is positioned in the equipment rack means such that a cable management zone is provided immediately below the rack-mount support means, the cable management zone providing free space to receive the cable management means.

15. A system according to claim 14, wherein the cable management means is connected to a stationary mount that is immovable relative to the equipment rack means, and connected to a movable mount that moves with the rack-mount support means.

16. A system according to claim 15, wherein the cable management means further comprises articulation means interconnecting the stationary mount and the movable mount.

17. A system according to claim 14, wherein the cable management means further comprises cable guide means for routing one or more cables from the equipment rack means to the rack-mount support means.

* * * * *